(12) United States Patent
Thacker, III

(10) Patent No.: US 10,903,175 B2
(45) Date of Patent: Jan. 26, 2021

(54) SEMICONDUCTOR DEVICE HAVING FEATURES TO PREVENT REVERSE ENGINEERING

(71) Applicant: Verisiti, LLC, Sanford, NC (US)

(72) Inventor: William Eli Thacker, III, Candler, NC (US)

( * ) Notice: Subject to any disclaimer, the term of this patent is extended or adjusted under 35 U.S.C. 154(b) by 0 days.

(21) Appl. No.: 16/599,633

(22) Filed: Oct. 11, 2019

(65) Prior Publication Data

US 2020/0058602 A1 Feb. 20, 2020

Related U.S. Application Data

(63) Continuation of application No. 15/976,077, filed on May 10, 2018, now Pat. No. 10,453,807, which is a continuation of application No. 15/287,288, filed on Oct. 6, 2016, now Pat. No. 9,972,585, which is a continuation of application No. 14/638,199, filed on Mar. 4, 2015, now Pat. No. 9,466,576, which is a continuation of application No. 14/036,827, filed on Sep. 25, 2013, now Pat. No. 8,975,748, which is a continuation-in-part of application No. 13/739,401, filed on Jan. 11, 2013, now abandoned, which is a continuation-in-part of application No. 13/663,921, filed on Oct. 30, 2012, now Pat. No. 9,287,879, which
(Continued)

(51) Int. Cl.
| | | |
|---|---|---|
| *H01L 23/00* | (2006.01) | |
| *H01L 23/522* | (2006.01) | |
| *H01L 27/02* | (2006.01) | |
| *H01L 23/528* | (2006.01) | |
| *H01L 27/11517* | (2017.01) | |
| *H01L 29/788* | (2006.01) | |
| *H01L 27/11524* | (2017.01) | |
| *H01L 27/06* | (2006.01) | |
| *H01L 49/02* | (2006.01) | |

(52) U.S. Cl.
CPC .......... *H01L 23/573* (2013.01); *H01L 23/528* (2013.01); *H01L 23/5223* (2013.01); *H01L 27/0203* (2013.01); *H01L 27/11517* (2013.01); *H01L 27/11524* (2013.01); *H01L 29/788* (2013.01); *H01L 23/5228* (2013.01); *H01L 27/0629* (2013.01); *H01L 28/24* (2013.01); *H01L 28/60* (2013.01); *H01L 2924/0002* (2013.01)

(58) Field of Classification Search
CPC ................. H01L 23/3238; H01L 23/52; H01L 27/11524; H01L 27/11517
See application file for complete search history.

(56) References Cited

U.S. PATENT DOCUMENTS 9,466,576 B2 * 10/2016 Thacker, III ...... H01L 27/11517
9,972,585 B2 * 5/2018 Thacker, III ........ H01L 23/5223

* cited by examiner

*Primary Examiner* — Cuong Q Nguyen

(57) ABSTRACT

An electronic device includes: a base layer; a first layer located at least partially over the base layer; a second layer located at least partially over the first layer; a first metal layer located at least partially over the second layer, wherein one or more signal outputs of the electronic device are formed in the first metal layer; and a second metal layer located at least partially over the first metal layer, wherein one or more gate connection is formed in the second metal layer, wherein removing a portion of the second metal layer disrupts at least one gate connection and deactivates the device.

3 Claims, 17 Drawing Sheets

Related U.S. Application Data is a continuation of application No. 13/194,452, filed on Jul. 29, 2011, now abandoned.

(60) Provisional application No. 61/494,172, filed on Jun. 7, 2011.

SCHEMATIC          LAYER GEOMETRY

SEMICONDUCTOR DEVICE HAVING FEATURES TO PREVENT REVERSE ENGINEERING

The present application is a continuation of U.S. patent application Ser. No. 15/976,077 filed May 10, 2018 which is a continuation of U.S. patent application Ser. No. 15/287,288 filed Oct. 6, 2016, which is a continuation of U.S. patent application Ser. No. 14/638,199 filed Mar. 4, 2015, which is a continuation of U.S. patent application Ser. No. 14/036,827 filed on Sep. 25, 2013, which is a continuation-in-part of U.S. patent application Ser. No. 13/739,401 filed on Jan. 11, 2013, which is a continuation-in-part of U.S. patent application Ser. No. 13/663,921, filed on Oct. 30, 2012, which is a divisional of U.S. patent application Ser. No. 13/194,452 filed on Jul. 29, 2011, which claims the benefit of U.S. Provisional Application Ser. No. 61/494,172 filed Jun. 7, 2011, each of which are incorporated by reference herein in their entirety.

BACKGROUND

It is desirable to design an electronic chip that is difficult to reverse engineer to protect the circuit design. Known reverse engineering techniques include methods for tearing down layers of the chip to expose the logic devices.

Semiconductor teardown techniques typically involve imaging a device layer, removing the layer, imaging the next layer, removing the layer, and so on until a complete representation of the semiconductor device is realized. Layer imaging is usually accomplished using an optical or electron microscope. Layer removal can be done by using physical means such as lapping or polishing, by chemical means by etching specific compounds, by using a laser or a focused ion beam technique (FIB), or by any other known method capable of removing the layers. FIG. 1 shows some of the semiconductor layers and regions that are imaged by the teardown reverse engineering technique.

Once the semiconductor device teardown is complete and the imaging information is gathered, the logic function of the device can be re-constructed by using diffusion, polysilicon, and well areas to define the MOS devices used to create logic gates, and the metal layers to define how the logic gates are interconnected. FIG. 2 shows how the semiconductor layers define the MOS device.

U.S. Pat. No. 7,711,964 discloses one method of protecting logic configuration data. The configuration data for the logic device is encrypted and a decryption key is encrypted using a silicon key. The encrypted decryption key and configuration are transferred to the logic device. The silicon key is used to decrypt the decryption key which is then used to decrypt the configuration data. One problem with this method is that the chip is not protected against physical reverse engineering as described above.

Many other cryptography techniques are known. But, all cryptographic techniques are vulnerable to the conventional teardown techniques.

Disclosed is a method for designing a semiconductor device that is resistant to these techniques. The semiconductor device includes a physical geometry which is not clearly indicative of the device's function. For example, the semiconductor device is designed where two or more types of logic devices have the same physical geometry. When the teardown method is performed two or more devices will show the same physical geometry, but, these two or more devices have different logic functions. This prevents the person performing the reverse engineering to determine the logic functions by the known methods of observing the geometry of the devices.

Employing the disclosed method and device will force the reverse engineer to employ more difficult techniques. These techniques are more time consuming, more expensive, and more likely to have errors.

SUMMARY

The present method and device presents a semiconductor device that it is difficult to reverse engineer using known techniques.

In one aspect, an electronic device comprises: a base layer; a first layer located at least partially over the base layer; a second layer located at least partially over the first layer; a first metal layer located at least partially over the second layer, wherein one or more signal outputs of the electronic device are formed in the first metal layer; and a second metal layer located at least partially over the first metal layer, wherein one or more gate connection is formed in the second metal layer, wherein removing a portion of the second metal layer disrupts at least one gate connection and deactivates the device.

In another aspect, an electronic device comprises: a base layer; a first layer located at least partially over the base layer; a second layer located at least partially over the first layer; a first metal layer located at least partially over the second layer, wherein one or more signal outputs of the electronic device are formed in the first metal layer; and a second metal layer located at least partially over the first metal layer, wherein the second metal layer is floating and one or more gate connection is connected to the second metal layer, wherein exposing the second metal layer to an ion beam results in at least one gate failure. Exposing the second metal layer to an ion beam results in at least one gate breakdown and creates at least one short between the gate, a source, and a drain of floating gate device.

In another aspect, an electronic circuit comprises: a plurality of devices having connected floating gates; and a metal layer connected to the connected floating gates, wherein exposing the metal layer to an ion beam results in the failure of at least one of the plurality of devices. The plurality of devices may comprise active devices such as N-type devices. Alternatively, the plurality of devices may comprise active devices such as P-type devices. The metal layer may be a top layer.

In another aspect, an electronic device comprises: a base layer; a first layer located at least partially over the base layer; a second layer located at least partially over the first layer; a first metal layer located at least partially over the second layer, wherein one or more signal outputs of the electronic device are formed in the first metal layer; a second metal layer located at least partially over the first metal layer, wherein the second metal layer is floating and one or more gate connection is connected to the second metal layer; a third metal layer located at least partially over the second metal layer and separated from the second metal layer by a dielectric, wherein exposing the third metal layer to an ion beam results in at least one gate failure of the gates connected to the second metal layer. The dielectric layer may be a passivation layer. Additionally, a fourth metal layer may be located at least partially over the third metal layer, wherein exposing the fourth metal layer to an ion beam results in at least one gate failure of the gates connected to the second metal layer.

These and other features and objects of the invention will be more fully understood from the following detailed description of the embodiments, which should be read in light of the accompanying drawings.

In this regard, before explaining at least one embodiment of the invention in detail, it is to be understood that the invention is not limited in its application to the details of construction and to the arrangements of the components set forth in the description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be used as a basis for designing other structures, methods, and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The accompanying drawings, which are incorporated in and form a part of the specification, illustrate embodiments of the present invention and, together with the description, serve to explain the principles of the invention.

DETAILED DESCRIPTION OF THE DRAWINGS

Many semiconductor processes that contain logic functions provide different types of metal-oxide-semiconductor (MOS) devices to be used in different environments. For example, one device can operate only at lower voltages and can be sized to minimum geometry. Another device can operate at higher voltages and cannot be sized to minimum geometry. Using this type of device allows the semiconductor device to interface to external signals that are higher in voltage when compared to the internal minimum sized devices.

The type of MOS device in the previous example is typically controlled by the electrical characteristics of the diffusion material. These characteristics are changed by slightly altering the atomic structure of this material by using an ion implant dose and energy. This process is normally described as "doping". This slight change of electrical properties cannot be detected by the conventional reverse engineering teardown techniques.

In order to provide a device that is resistant to these reverse engineering techniques, an invisible bias generator (IBG) has been developed. An IBG may be defined as an electronic device having at least two internal devices where the physical geometries of the internal devices cannot be used to determine the operating characteristics of the IBG.

One example of an IBG is a device where both internal devices have the same geometry but operate differently. For example, the first device may be a transistor that operates at a first voltage level and the second device is a transistor that operates at a different voltage level. In another example, the first device is a silicide resistor while the second device is a non-silicide resistor. In another example, conductive ink is used to create an electronic circuit and the amount of conductive material in the ink is changed between two of the elements.

Another example of an IBG is a device where both internal devices have different geometries but have the same operating characteristics. For example, the first device may be a transistor that operates with first characteristics and the second device is larger a transistor that operates with the same characteristics. In another example, the first device is a silicide resistor while the second device is a non-silicide resistor. In another example, conductive ink is used to create an electronic circuit and the amount of conductive material in the ink is changed between two of the elements.

Another example of an IBG circuit includes devices having multiple possible geometries and multiple possible operating characteristics, with no apparent correlation existing between a given geometry and an operating characteristic.

Figure 1:
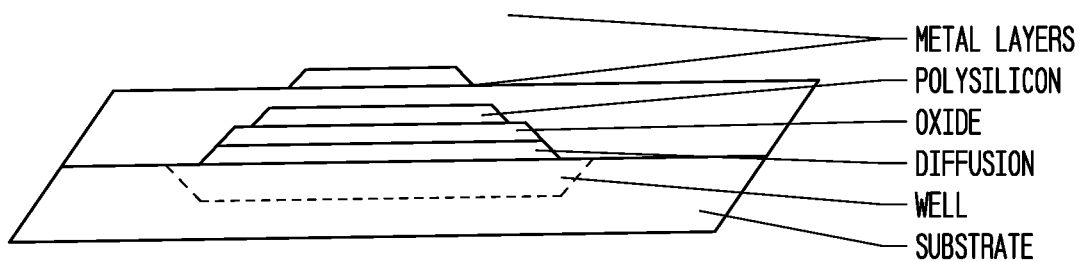
FIG. 1 illustrates semiconductor layers and regions that are imaged by the teardown reverse engineering technique.
Figure 2:
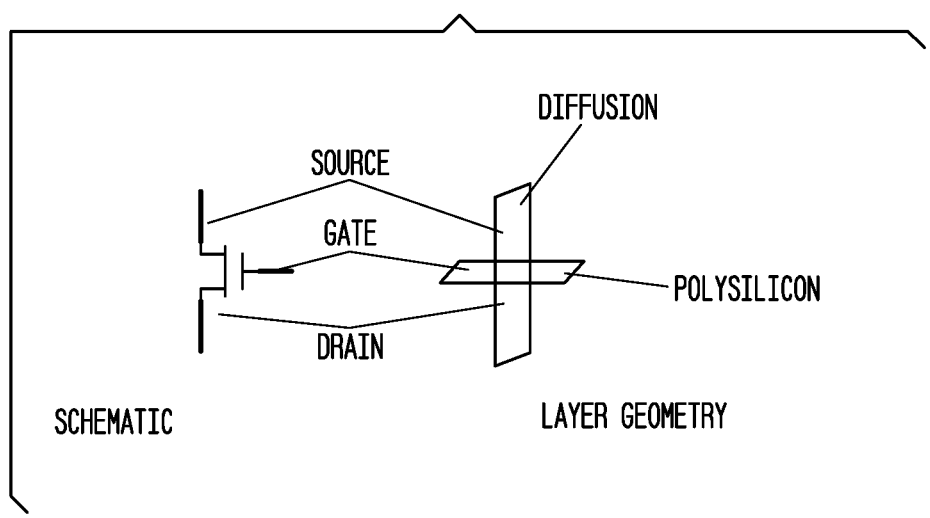
FIG. 2 illustrates how the semiconductor layers define the MOS device.
Figure 3:
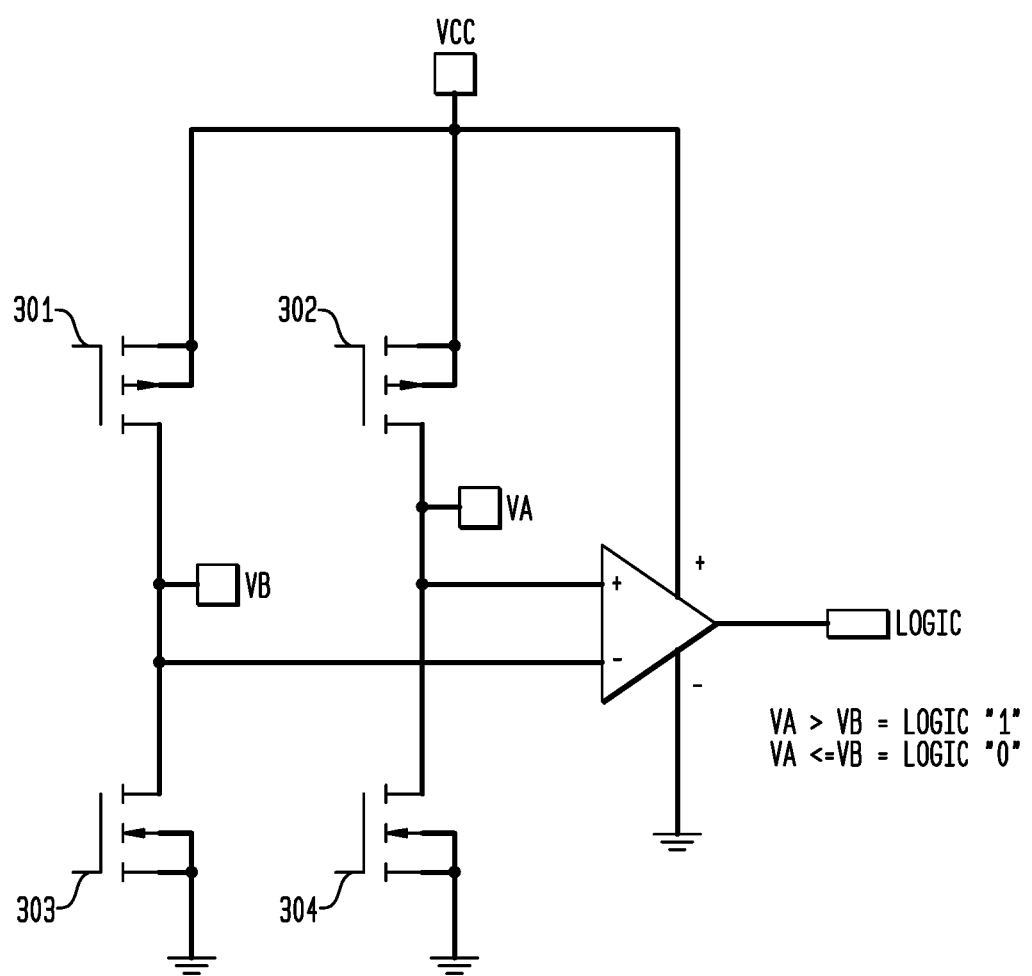
FIG. 3 illustrates a circuit that is resistive to conventional reverse engineering techniques.

FIG. 3 illustrates an exemplary IBG circuit 300 that provides an effective deterrent to semiconductor device teardown techniques. The circuit 300 includes a first IBG device comprising a P-channel device 301 and an N-channel device 303 which are connected in series between a power source (VCC) and a ground. A second IBG device comprises a P-channel device 302 and an N-channel device 304 also connected in series between VCC and ground. In one aspect of the present invention, the devices 301-304 may comprise MOS transistors. In a preferred embodiment, the devices 301-304 may also exhibit identical device geometry. The gates on the P-channel devices 301, 302 are floating as they not provided with an input signal (floating gates) and are charged via leakage current to a voltage level approximately VCC minus the threshold voltages of the devices 301 and 302, each of the threshold voltages is independent. The gates on the N-channel devices 303, 304 are also floating gates and are charged via leakage current to a voltage level of approximately ground plus the threshold voltages of the devices 303 and 304.

Each device 301-304 may include a conduction channel between a source and a drain of the device. The depth of the conduction channel is determined by the doping levels of the diffusion (also known as implantation) areas of the gates of devices 301-304 which in turn determine the voltage level on the P and N channel device junctions, labeled VA and VB in FIG. 3. In one aspect of the present invention, the devices 301-304 are formed with different doping levels (also called impurity levels) between at least some of the devices 301-304 while maintaining identical device geometry, thus resulting in the device junctions VA and VB having different voltage levels. A comparator 310 detects the voltage levels of VA and VB and based on the difference in these voltage bias levels outputs a logical "1" or "0". VA and VB can be any voltage level as the logic criteria of the comparator 310 is based on the difference of these voltages. In a preferred embodiment, the circuit of FIG. 3 contains identical geometry for the P and N channel devices 301-304, thus causing the doping level difference between the devices 301-304 to control the difference in the voltage levels of the device junctions VA and VB. For example, if devices 301 and 303 are doped to form low voltage MOS transistors (such as 2.5 V, for example) and if devices 302 and 304 are doped differently to form high voltage MOS transistors (such as 3.3 V, for example), then device junction VA is at a higher voltage than device junction VB, and the output of the comparator will be a logical "1". As another example, if devices 301 and 304 are doped to form low voltage MOS transistors, and if devices 302 and 303 are doped to form high voltage MOS transistors, then device junction VA is at a lower voltage than device junction VB, and the output of the comparator will be a logical "0". The logic function of this circuit is invisible to reverse engineering teardown techniques since the operating voltages of the device junctions VA and VB are controlled by the doping levels and these doping levels are not determinable by conventional techniques.

For semiconductor technologies which provide different types of MOS devices, such as the high and low voltage devices described above, an advantage of the IBG circuit is that it can be easily constructed with current methods. Also, an IBG circuit in accordance with one aspect of the present invention can be used to create a number of different of logic cells by varying the number of high voltage devices and low voltage devices.

Figure 4:
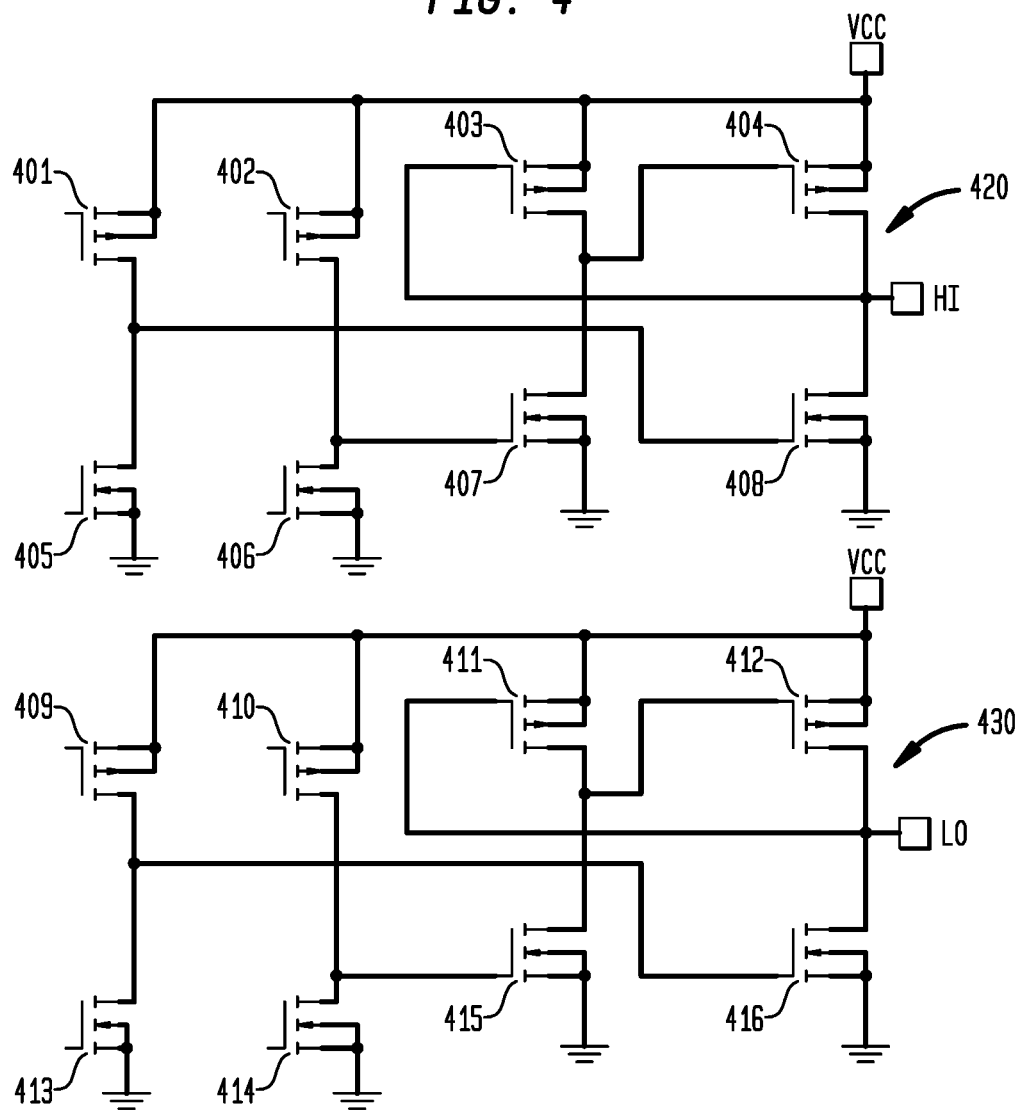
FIG. 4 illustrates a circuit configuration using a level shifter.

FIG. 4 shows an exemplary circuit 420 including an IBG and a level shifter circuit which produces a logical "1", or high, output in accordance with one aspect of the present invention. The IBG portion of the circuit 420 comprises transistors 401, 402, 405, and 406 each having a floating gate input. P-channel transistor 401 is connected in series with N-channel transistor 405 at output node 401A, and P-channel transistor 402 is connected in series with N-channel transistor 406 at output node 402A. Each of the transistors of the IBG portion of the circuit can be a P-type or an N-type device. Also each transistor can be a high voltage device or a low voltage device. In a preferred embodiment, a high voltage device operates at 3.3 V while a low voltage device operates at 2.5 V. In an exemplary embodiment, transistor 402 is a low voltage P-type device, transistor 401 is a high voltage P-type device, transistor 405 is a low voltage N-type device, and transistor 406 is a high voltage N-type device, resulting in the voltage level at output node 402A being higher than the voltage level at the output node 401A. For example, transistors 401 and 405 may produce a voltage level of about 100 mV at the output node 401A and transistors 402 and 406 may produce a voltage level of about 1.5 V at the output node 402A. These output levels fall short of being VCC and ground due to transistors 401, 402, 405, and 406 not being fully turned ON or OFF by the charge on their floating gates which are charged by leakage currents. Transistors 401, 402, 405 and 406 are selected to ensure the voltage levels of the output nodes 401A and 402A are such the one voltage level is higher and the other voltage level is lower than the threshold voltage of transistors 407 and 408, described below.

The voltage levels of the output nodes 401A and 402A of the IBG circuit are insufficient to interface directly with digital logic due to the voltage level of the gates of the transistors 401, 402, 405 and 406. To properly interface with digital logic, the signals from the output nodes 401A and 402A are input to a level shifting circuit comprising transistors 403, 404, 407 and 408. Transistors 403 and 404 may comprise low voltage P-type devices and transistors 407 and 408 may comprise low voltage N-type devices. The output node 401A of the IBG circuit is connected to the gate of N-channel transistor 408 of the level shifting circuit and the output node 402A of the IBG circuit is connected to the gate of the N-channel transistor 407 of the level shifting circuit. In an exemplary embodiment, the N-channel transistors may have a threshold voltage of about 700 mV. Thus, the 100 mV voltage level of node 401A which is input to the gate of transistor 408 will turn transistor 408 "OFF" and the 1.5 V voltage level which is input to the gate of transistor 407 will turn transistor 407 "ON". Thus, transistor 403 will be turned "OFF" and transistor 404 will be turned "ON", resulting in the output of the level shifting circuit being a logical "1" or HI.

FIG. 4 also shows also an exemplary circuit 430 including an IBG and level shifting circuit which produces a logical "0", or low, output in accordance with one aspect of the present invention. The IBG portion of the circuit 420 comprises transistors 409, 410, 413, and 414 each having a floating gate input. P-channel transistor 409 is connected in series with N-channel transistor 413 at output node 409A, and P-channel transistor 410 is connected in series with N-channel transistor 414 at output node 410A. Each of the transistors of the IBG portion of the circuit can be a P-type or an N-type device. Also each transistor can be a high voltage device or a low voltage device. In a preferred embodiment, a high voltage device operates at 3.3 V while a low voltage device operates at 2.5 V. In an exemplary embodiment, transistor 409 is a low voltage P-type device, transistor 410 is a high voltage P-type device, transistor 413 is a high voltage N-type device, and transistor 414 is a low voltage N-type device, resulting in the voltage level at output node 409A being higher than the voltage level at the output node 410A. For example, transistors 410 and 414 may produce a voltage level of about 100 mV at the output node 410A and transistors 409 and 413 may produce a voltage level of about 1.5 V at the output node 409A. Transistors 409, 410, 413 and 414 are selected to ensure the voltage levels of the output nodes 409A and 410A are such the one voltage level is higher and the other voltage level is lower than the threshold voltage of transistors 415 and 416, described below.

The voltage levels of the output nodes 409A and 410A of the IBG circuit are insufficient to interface directly with digital logic due to the voltage level of the gates of the transistors 409, 410, 413 and 414. To properly interface with digital logic, the signals from the output nodes 409A and 410A are input to a level shifting circuit comprising transistors 411, 412, 415 and 416. Transistors 411 and 412 may comprise low voltage P-type devices and transistors 415 and 416 may comprise low voltage N-type devices. The output node 409A of the IBG circuit is connected to the gate of N-channel transistor 416 of the level shifting circuit and the output node 410A of the IBG circuit is connected to the gate of the N-channel transistor 415 of the level shifting circuit. In an exemplary embodiment, the N-channel transistors may have a threshold voltage of about 700 mV. Thus, the 1.5 V voltage level of node 409A which is input to the gate of transistor 416 will turn transistor 416 "ON" and the 100 mV voltage level which is input to the gate of transistor 415 will turn transistor 415 "ON". Thus, transistor 412 will be turned "OFF" and transistor 411 will be turned "ON", resulting in the output of the level shifting circuit being a logical "0" or LO.

As described above, the circuit 420 gives the "HI" voltage output while circuit 430 gives the "LO" voltage output. The geometry and size of the IBG transistors 401, 402, 405 and 406 of the circuit 420 may be identical to the geometry and size of the IBG transistors 409, 410, 413 and 414 of the circuit 430. The only discernable difference between the two devices is the level of doping between the high voltage transistors and the low voltage transistors. Because the size and the geometry of IBG transistors of device 420 may be identical to the IBG transistors of device 430, it is not possible to determine the difference between these two devices using the conventional reverse engineering teardown techniques.

Figure 5:
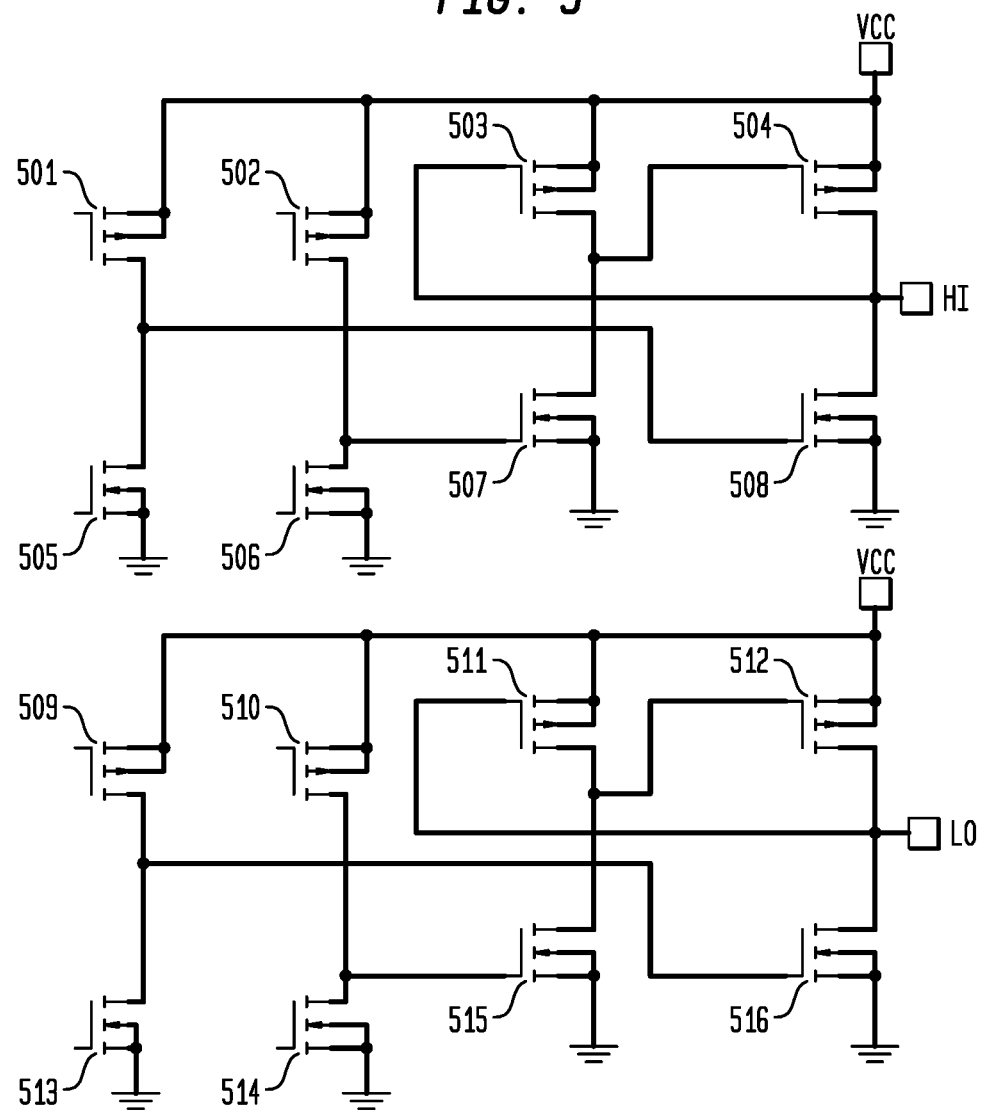
FIG. 5 illustrates a second configuration using a level shifter.

FIG. 5 illustrates a second example of IBG circuits and level shifting circuits to output a "HI" or "LO" output. Similar to the embodiment shown in FIG. 4, there are 16 transistor devices (501 through 516). Each of the transistors can be a P-type or an N-type device. Also each device can be a high voltage device or a low voltage device. In a preferred embodiment, a high voltage device operates at 3.3 V while a low voltage device operates at 2.5 V. In an exemplary embodiment, transistors 502, 503, 504, 509, 511, and 512 are low voltage P-type devices. Transistor 501 and 510 are high voltage P-type devices. Transistors 505, 507, 508, 514, 515, and 516 are low voltage N-type devices. Transistors 506 and 513 are high voltage N-type devices. Device 520 gives the "HI" voltage output while device 530 gives the "LO" voltage output. The geometry and size of the IBG transistors 501, 502, 505, and 506 of the device 520 may be identical to the geometry and size of transistors 509, 510, 513 and 514 of device 530. The only discernible difference between the two devices is the level of doping between the high voltage transistors and the low voltage transistors. Because the size and the geometry of the IBG transistors of device 520 is identical to that of the IBG transistors of device 530 it is not possible to determine the difference between these two devices using the conventional reverse engineering teardown techniques.

If a semiconductor chip contains an IBG as described in FIG. 4 or FIG. 5, it is extremely difficult for someone trying to reverse engineer the chip using teardown techniques to determine the function of the IBG devices placed on the chip because the geometry of the internal devices are the same.

Figure 6:
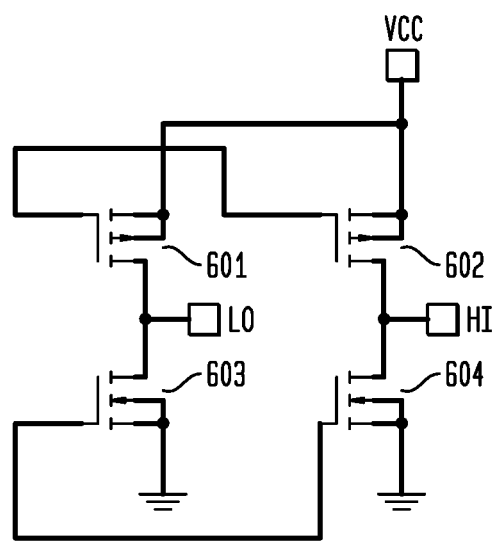
FIG. 6 illustrates a circuit configuration without a comparator.
Figure 7:
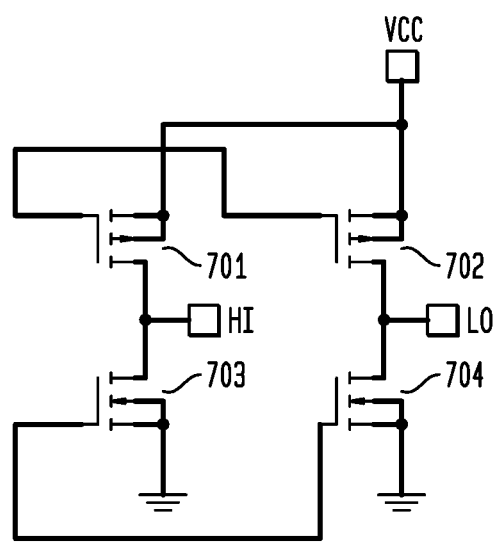
FIG. 7 illustrates a second circuit configuration without a comparator.

FIG. 6 and FIG. 7 illustrate examples of IBGs where the voltage levels of the outputs of the circuits are sufficient to directly interface with the devices on a chip. In FIG. 6, device 601 is a high voltage P-type device, such as 3.3 v, device 602 is a low voltage P-type device, such as 2.5 v, device 603 is a low voltage N-type device and 604 is a high voltage N-type device. By connecting the gate of device 601 to the gate of device 602, these devices share the leakage current, resulting in the high voltage device 601 being fully turned OFF and the low voltage device 602 being fully turned ON. Similarly, by connecting the gate of device 603 to the gate of device 604, these devices share the leakage current, resulting in the low voltage device 603 being fully turned ON and device 604 being fully turned OFF. Output node 601A will be sufficiently close to ground to function as a logical "0" and interface directly with other CMOS devices and output node 602A will be sufficiently close to VCC to function as a logical "1" and interface directly with other CMOS devices.

In FIG. 7, device 701 is a low voltage P-type device, such as 2.5 V, device 702 is a high voltage P-type device, such as 2.5 V, device 704 is a low voltage N-type device and 703 is a high voltage N-type device. By connecting the gate of device 701 to the gate of device 702, these devices share the leakage current, resulting in the low voltage device 701 being fully turned ON and the high voltage device 702 being fully turned OFF. Similarly, by connecting the gate of device 703 to the gate of device 704, these devices share the leakage current, resulting in the high voltage device 703 being fully turned OFF and low voltage device 704 being fully turned ON. Output node 701A will be sufficiently close to VCC to function as a logical "1" and interface directly with other CMOS devices and output node 702A will be sufficiently close to ground to function as a logical "0" and interface directly with other CMOS devices.

The geometry and size of the IBG transistors 601, 602, 603 and 604 may be identical to the geometry and size of the IBG transistors 701, 702, 703 and 704 The geometry and size of IBG transistors 601, 602, 603, and 604 may not be identical to each other. The geometry and size of IBG transistors 701, 702, 703 and 704 may not be identical to each other. Additionally, the voltage levels at the gates of the gate connected transistors are equal. The only discernible difference between the two devices is the level of doping between the high voltage transistors and the low voltage transistors. Because the size and the geometry of IBG transistors of FIG. 6 may be identical to the IBG transistors of device FIG. 7, it is not possible to determine the difference between these two devices using the conventional reverse engineering teardown techniques. The IBG shown in FIG. 6 has the same geometry as the IBG shown in FIG. 7 with the only difference being the doping level of some of the transistors. Therefore, if a chip is designed using the IBG illustrated in FIG. 6 and the IBG illustrated in FIG. 7, it is very difficult to determine a difference in the function of the devices made by each design.

The IBG shown in FIG. 6 can include different configurations. In one example, device 601 is a low voltage P-type device, device 602 is a high voltage P-type device, device 603 is a low voltage N-type device and 604 is a high voltage N-type device. In another example device 601 is a high voltage P-type device, device 602 is a low voltage P-type device, device 603 is a high voltage N-type device and 604 is a high voltage N-type device. In another example device 601 is a high voltage P-type device, device 602 is a low voltage P-type device, device 603 is a low voltage N-type device and 604 is a low voltage N-type device. In another example device 601 is a high voltage P-type device, device 602 is a low voltage P-type device, device 603 is a low voltage N-type device and 604 is a high voltage N-type device. There are a total of sixteen configurations possible for a four device IBG.

Figure 8:
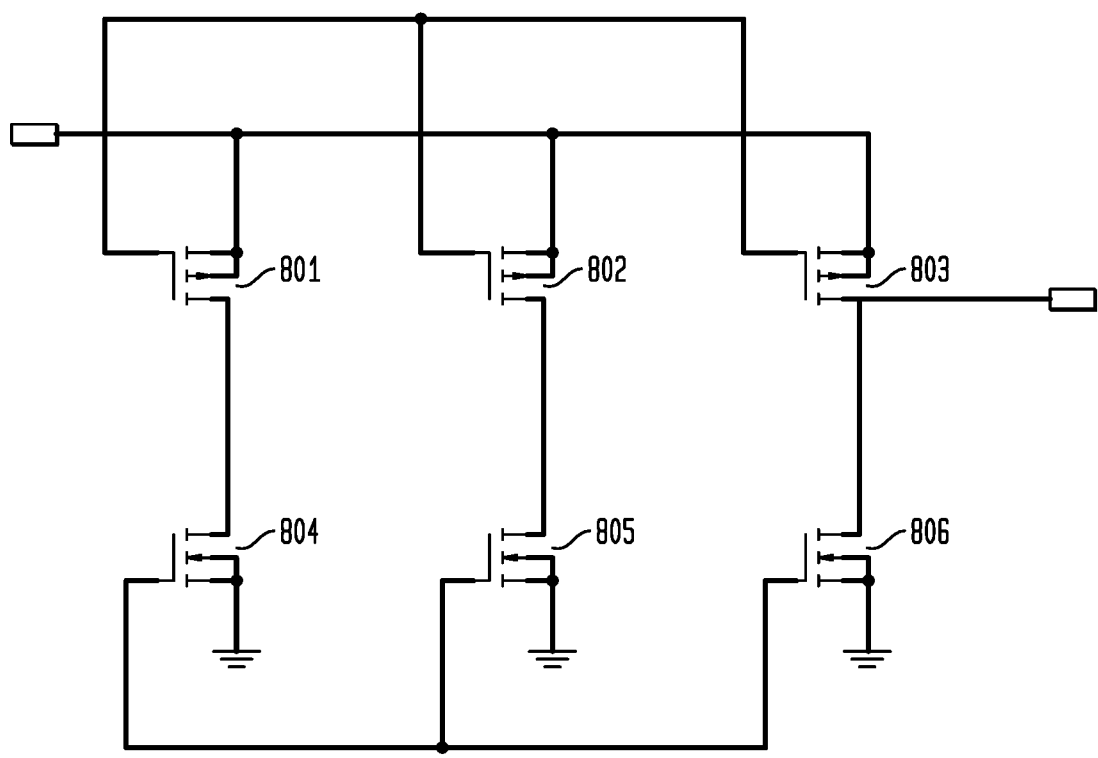
FIG. 8 illustrates an circuit configuration having six active devices.

FIG. 8 illustrates another embodiment of an IBG circuit. Devices 801, 802, 803 are shown as P-type devices and can be any combination of high voltage or low voltage devices. Devices 804, 805, 806 are shown as N-type devices and can be any combination of high voltage or low voltage devices. However, the six devices shown can be any combination of P-type and N-type devices. The six device IBG has a total of 64 possible configurations. Furthermore, an IBG can be comprised of any number of active devices with 2 to the "n" number of combinations, where n is the number of active devices.

Figure 9A:
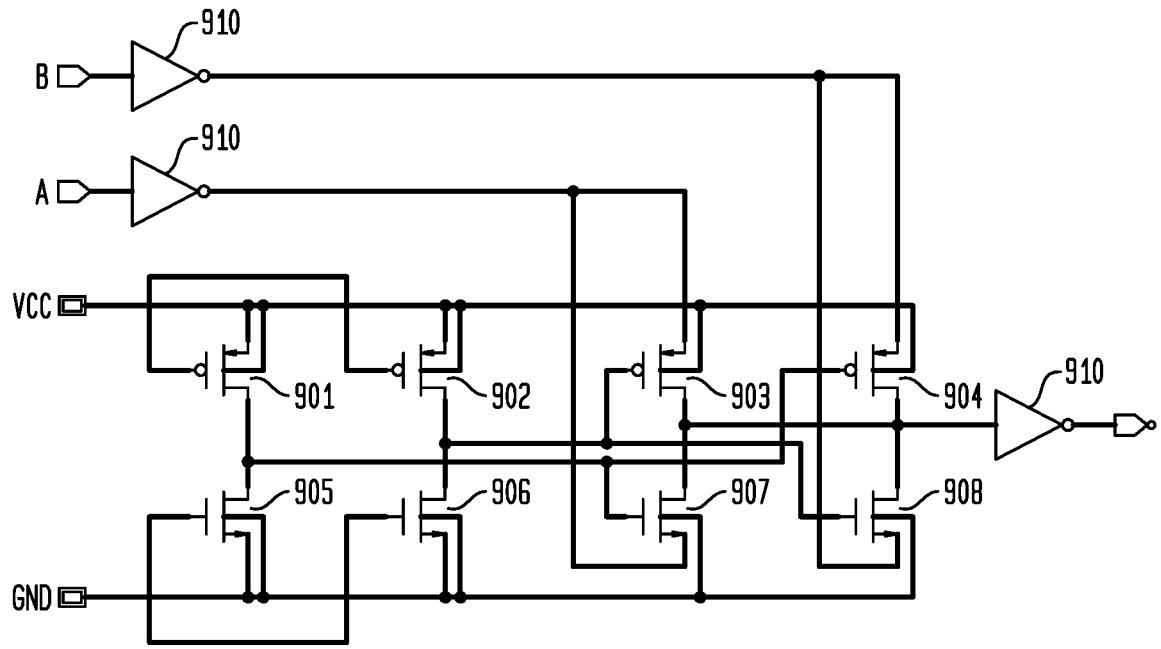
FIG. 9A illustrates a multiplexer using the disclosed techniques.
Figure 9B:
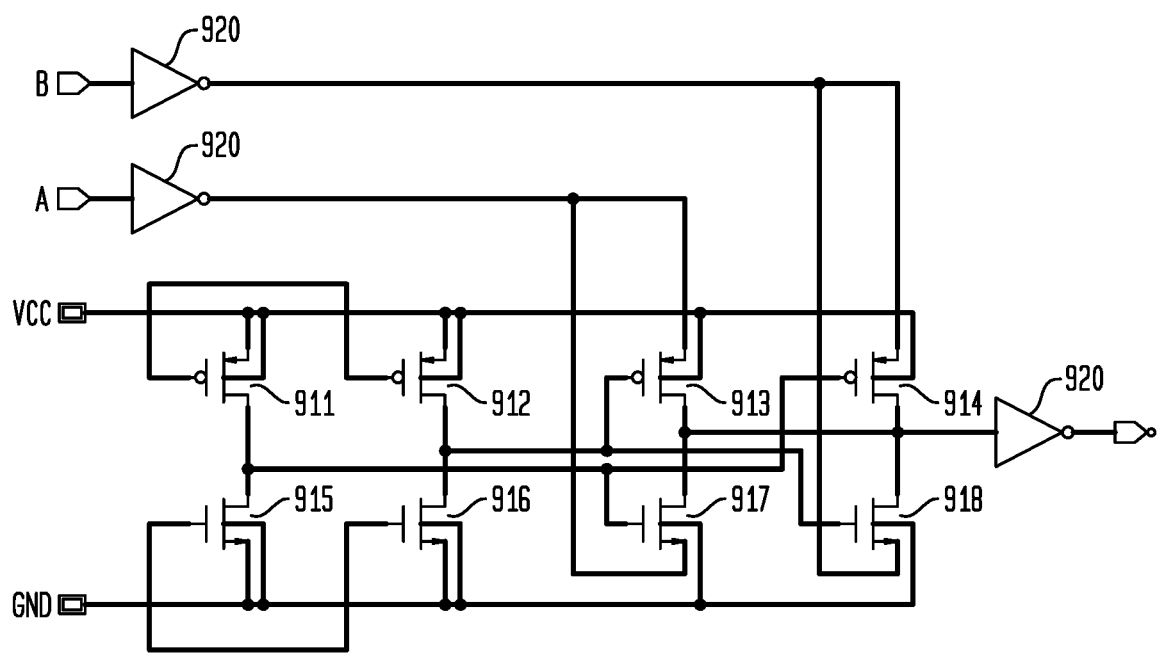
FIG. 9B illustrates a second embodiment of a multiplexer using the disclosed techniques.

FIG. 9A and FIG. 9B illustrate IBG circuits which include multiplexers. Because IBG circuits may be used to select logic functions, it is convenient to implement these circuits in conjunction with digital multiplexers that effectively steer one of two inputs to its output. These IBG based multiplexers select an input base solely on the IBG function. In FIG. 9A, transistors 901, 902, 905 and 906 comprise an IBG circuit and transistors 903, 904, 907 and 908 comprise a multiplexer. In FIG. 9B, transistors 911, 912, 915 and 916 comprise an IBG circuit and transistors 917, 918, 913 and 914 comprise a multiplexer. In FIG. 9A, devices 901 and 906 are 3.3V devices while devices 902, 903, 904, 905, 907, and 908 are 2.5V devices. Inverter 910 provides the inverse of input A and the inverse of input B. In FIG. 9B, devices 912 and 915 are 3.3V devices while devices 911, 913, 914, 916, 917, and 918 are 2.5V devices. Inverter 920 provides the inverse of input A and the inverse of input B. Based on the outputs of the IBG transistors 901, 902, 905 and 906, the multiplexer shown in FIG. 9A selects the B input while the multiplexer shown in FIG. 9B selects the A input based on the outputs of the IBG transistors 911, 912, 915 and 916. The only discernible difference between the two devices is the level of doping between the high voltage transistors and the low voltage transistors. Because the size and the geometry of transistors of FIG. 9A may be identical to the transistors of FIG. 9B, it is not possible to determine the difference between these two devices using the conventional reverse engineering teardown techniques. The IBG shown in FIG. 9A may have the same geometry as the IBG shown in FIG. 9B with the only difference being the doping level of some of the transistors. Therefore, if a chip is designed using the circuit illustrated in FIG. 9A and the circuit illustrated in FIG. 9B, it is very difficult to determine a difference in the function of the devices made by each design. The only difference between these circuits is the configuration of 3.3V and 2.5V devices.

Figure 10:
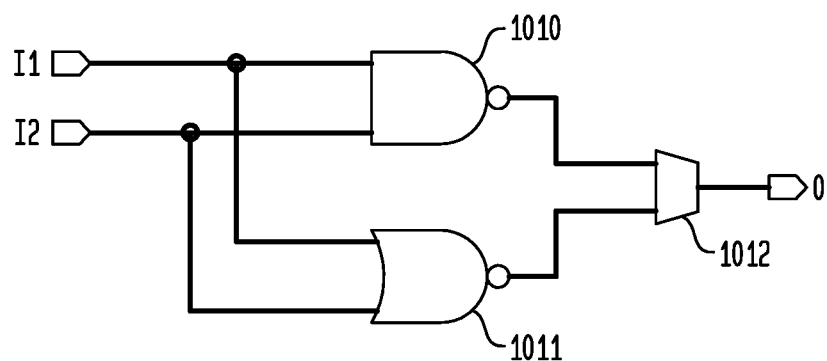
FIG. 10 illustrates the implementation of a "NAND" logic function.
Figure 11:
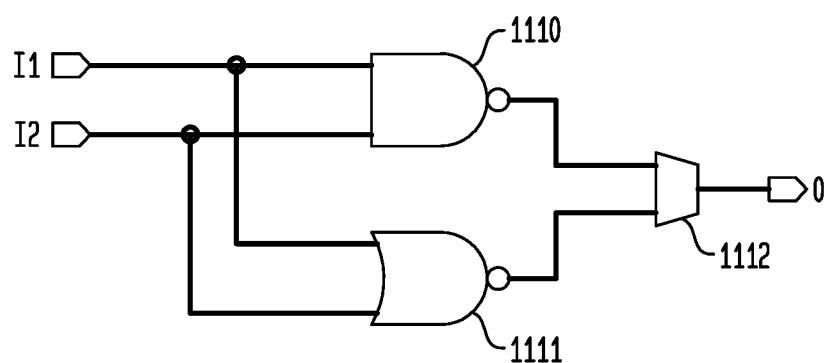
FIG. 11 illustrates the implementation of a "NOR" logic function.

FIG. 10 represents the implementation of a "NAND" logic function and FIG. 11 illustrates the implementation of a "NOR" logic function. In FIG. 10, NAND gate 1010 and NOR gate 1011 output to an IBG based multiplexer 1012, such as the IBG circuit multiplexer shown in FIG. 9A, which selects the output of the NAND gate 1010. In FIG. 11, NAND gate 1110 and NOR gate 1111 output to an IBG based multiplexer 1112, such as the IBG circuit multiplexer shown in FIG. 9B, which selects the output of the NOR gate 1111. These two implementations appear to identical during reverse engineering because the difference between these configurations is the IBG circuit. Without knowledge of the IBG circuit the logic function of these configurations is indeterminate.

Figure 12:
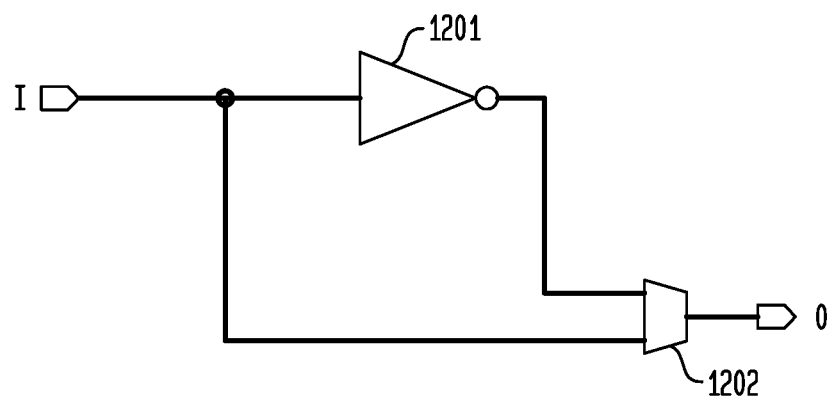
FIG. 12 illustrates the implementation of a "INVERT" logic function.
Figure 13:
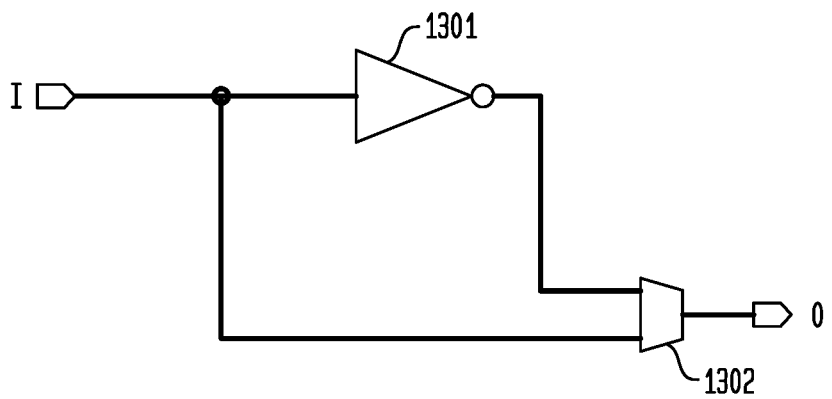
FIG. 13 illustrates the implementation of a "BUFFER" logic function.
Figure 14:
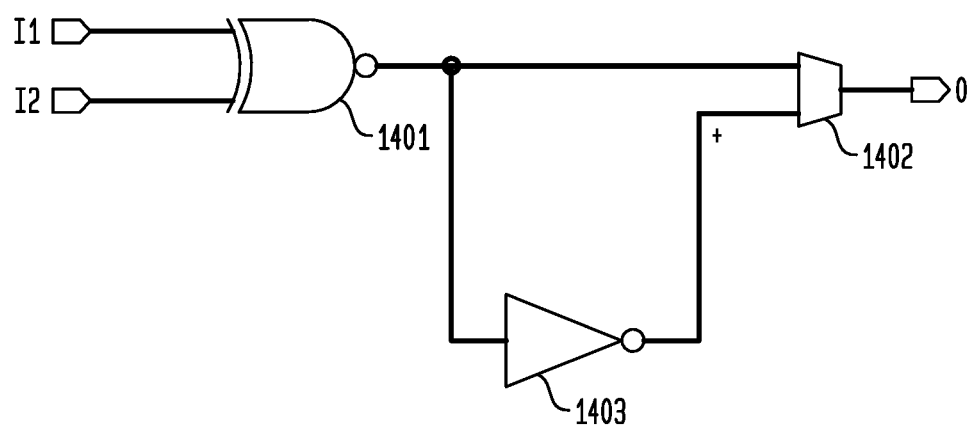
FIG. 14 illustrates the implementation of a "XOR" logic function.
Figure 15:
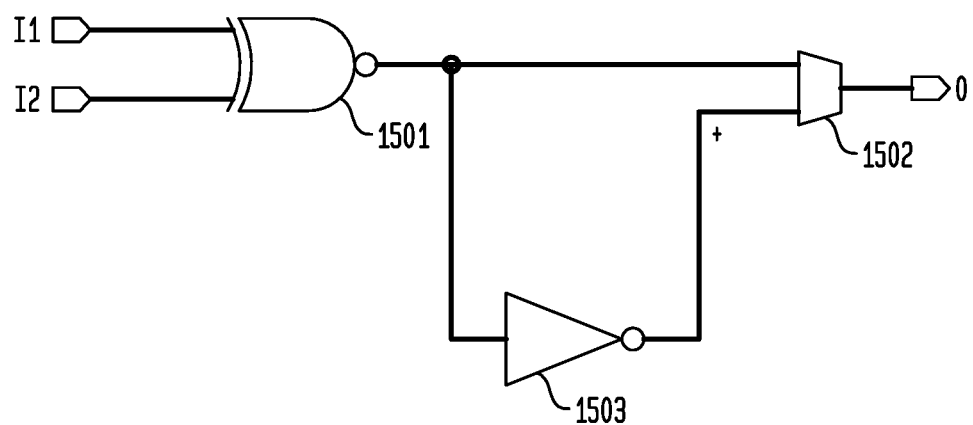
FIG. 15 illustrates the implementation of a "XNOR" logic function.

FIG. 12 illustrates an implementation of the logic function "INVERT" comprising an inverter 1201 and an IBG based multiplexer 1202, such as the IBG circuit multiplexer shown in FIG. 9A, implemented to select the inverted input. FIG. 13 illustrates an implementation of the logic function "BUFFER" comprising an inverter 1301 and an IBG based multiplexer 1302, such as the IBG circuit multiplexer shown in FIG. 9B, implemented to select the non-inverted input. FIG. 14 illustrates an implementation of the logic function "XOR" comprising an exclusive-or gate 1401, an inverter 1403 and an IBG based multiplexer 1402, such as the IBG circuit multiplexer shown in FIG. 9A, implemented to select the output of the gate 1401. FIG. 15 illustrates an implementation of the logic function "XNOR" comprising an exclusive-nor gate 1501, an inverter 1503 and an IBG based multiplexer 1502, such as the IBG circuit multiplexer shown in FIG. 9B, implemented to select the output of the inverter 1503. As with the previous examples, reverse engineering a chip that has both the "INVERT" of FIG. 12 and the "BUFFER" of FIG. 13 will be difficult to perform because the "INVERT" and the "BUFFER" will have the same appearance. Reverse engineering a chip that has both the "XOR" of FIG. 14 and the "XNOR" of FIG. 15 is difficult because the "XOR" and "XNOR" have the same appearance. As described above, each pair of implementations is indeterminate without knowledge of the logical operation of the IBG circuit based multiplexers.

One advantage of the high voltage/low voltage method of anti-reverse engineering deterrent is that most processes support this distinction. Many implementations are designed to use low voltages internal voltages because as feature size decreases the internal voltage decreases. But, many devices outside of the chip operate at higher voltages and the chips must be able to interface with these devices. Therefore, devices that use higher voltages are still used and being developed. It is possible to for the difference between the low voltage device and the high voltage device to be achieved using small doping changes between P and N devices.

The IBG devices described above include active devices that use the dopant level to control characteristics of the devices. As an example, it is known in a particular process that a doping concentration difference between the 2.5V and 3.3V devices is about 8xE16 atoms/cm3. Structures that have doping density differences below 1xE17 are candidates for IBG design. Examples of IBGs are in FIG. 16.

There are many other combinations of devices that will work besides the 2.5V and 3.3V devices. For example, a 2.5V can be used with a 5V device. A 1.8V device, a 1.5V device, or a 1.2V can be used with a 3.3V device. A 1.2V device can be used with 1.8V or a 2.5V device. A 1.0V device can be used with a 1.8V device, 2.5V device, or a 3.3V device. A 0.85V device can be used with a 1.8V device, a 2.5V device, or a 3.3V device. This list is exemplary only and any combination of devices that can be made with the same physical geometry can be used.

Figure 16A:
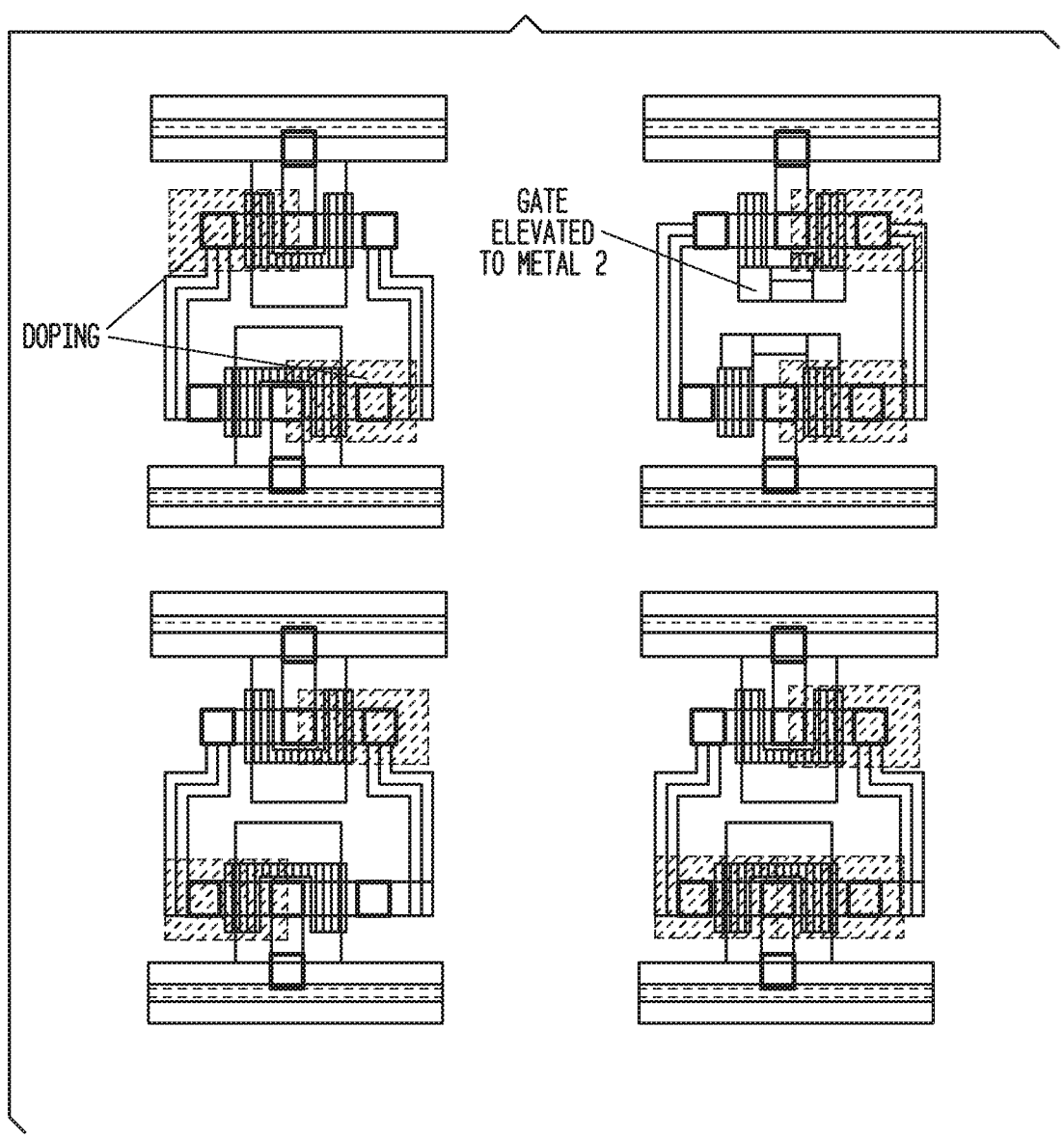
FIG. 16A illustrates an IBG device having active components.
Figure 16B:
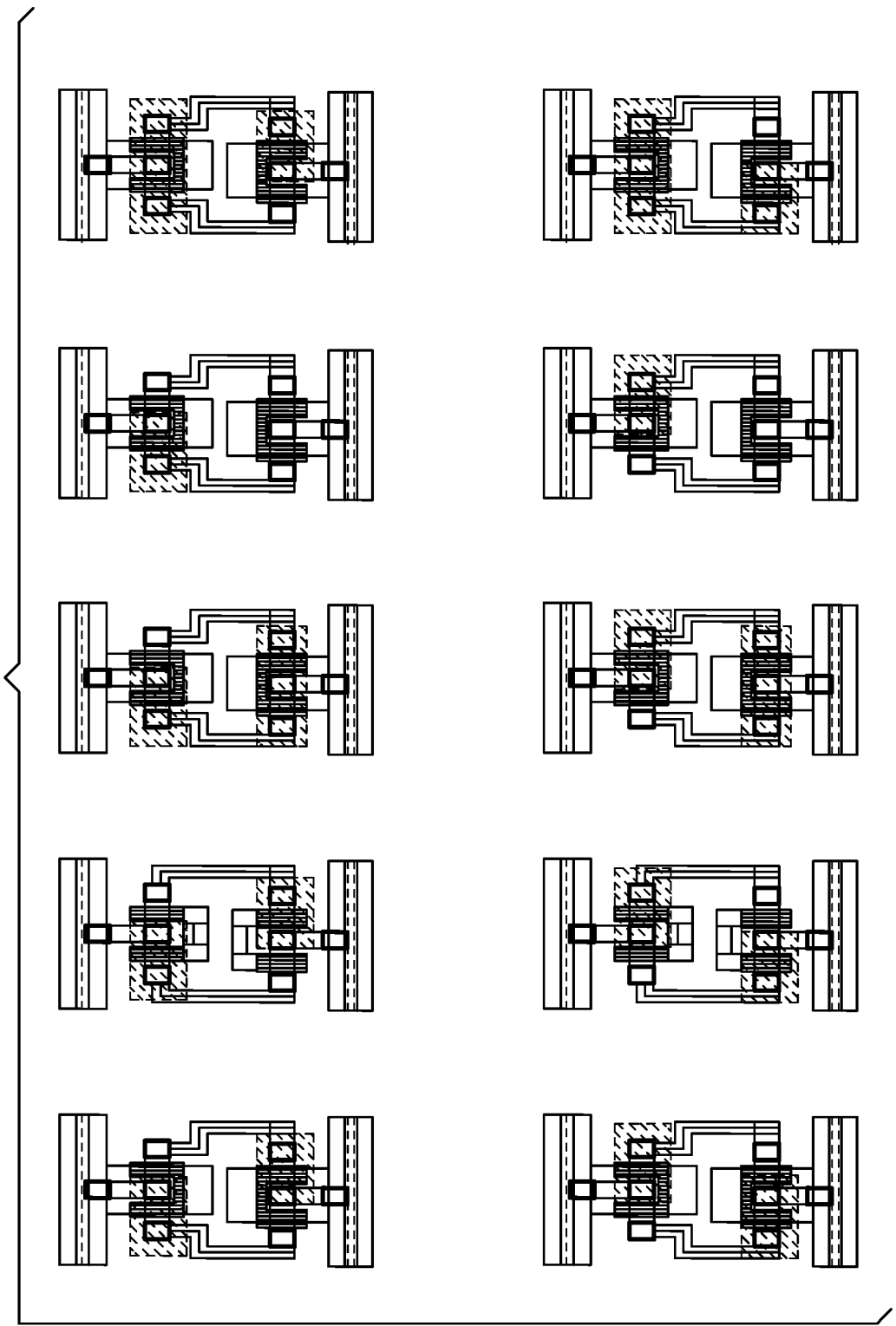
FIG. 16B illustrates alternative embodiments of IBG devices having active components.

The previous examples illustrate some of the possible implementations of IBG devices using active devices. Another way to achieve an IBG device is to use inactive devices. The IBG can be made using a silicide poly resistor and a non-silicide poly resistor. The first device is used to set the first bias voltage as an active bias voltage and the second device is used to set the set the second bias voltage as an active bias voltage. The difference between the silicide poly resistor and the non-silicide poly resistor will not be apparent to the conventional reverse engineering techniques because the resistors have the same geometry. FIG. 16A illustrates an example of an IBG device. FIG. 16B illustrates other examples of an IBG device.

Polysilicon has fairly high resistivity, about a few hundred μΩ-cm. Resistive devices from polysilicon suffer from this high resistivity because as the device dimension shrinks the resistance of the polysilicon local interconnection increases. This increased resistance causes an increase in the power consumption and a longer RC time delay. Silicides are added to polysilicon devices because the addition of the silicides reduces the resistance and increases device speed. Any silicide that has a much lower resistivity than polysilicon may be used. Titanium silicide ($TiSi_2$) and tungsten silicide ($WSi_2$) are two silicides that are commonly used.

Next, one method of forming a silicide device is described. A self-aligned silicide process is conventionally used to from Titanium Silicide. Initially, chemical solutions are used to clean the wafer surface in order to remove contaminants and particles. Next, the wafer is sputtered in a vacuum chamber using argon to remove the native oxide from the wafer surface. Next, a layer of the wafer surface is sputtered to deposit a layer of titanium on the wafer surface. This results in a wafer having the silicon exposed at the source/drain and on top of the polysilicon gate. Next, a titanium silicide is formed on the polysilicon by using a thermal annealing process. For example, annealing can be performed in a rapid thermal process to form titanium silicide on top of the polysilicon and on the surface of the source/drain. Because titanium does not react with silicon dioxide, silicide is formed only where polysilicon directly contacts with titanium. Next, the unreacted titanium is removed by using a wet etch process that exposes the unreacted titanium to a mixture of hydrogen peroxide ($H_2O_2$) and sulfuric acid ($H_2SO_4$). Lastly, the wafer is annealed which increases the grain size of the titanium Silicide. The increased grain size improves the wafer's conductivity and reduces wafer's contact resistance.

Another characteristic that can be controlled in the IBG device is the threshold voltage. The threshold of MOS transistors can be controlled by threshold adjustment implant. An ion implantation process is used to ensure that the power supply voltage of the electronic systems can turn the MOS transistor in the IC chip on and off. The threshold adjustment implantation is a low-energy and low current implantation process. Typically, the threshold adjustment implantation is performed before gate oxide growth. For CMOS IC chips, two threshold adjustment implantation processes are needed, one for p-type and one for n-type.

In an IBG device, the process described above can be used to produce resistors that have the same physical dimensions and have different resistance. Conversely, the process can be used to produce resistors that have different geometries and the same resistance.

Figure 17:
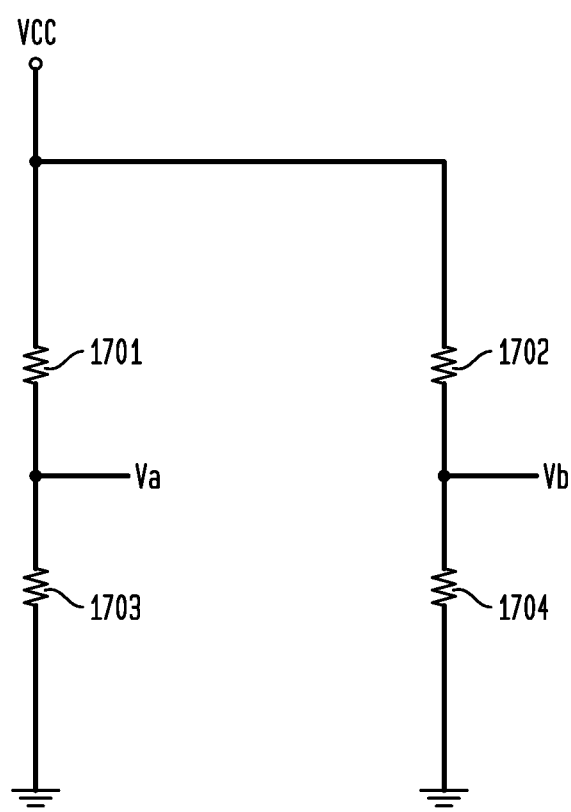
FIG. 17 illustrates a circuit comprised of resistors.

FIG. 17 illustrates an example of an IBG device implemented by silicide resistors. A voltage source VCC is connected to a circuit having resistors 1701, 1702, 1703, 1704. The resistance of the resistors can be set by the method described above to have two different resistance levels with all of the resistors having the same physical geometry. For example, resistors 1701 and 1704 may be non-silicide resistors while resistors 1702 and 1703 are silicide resistors. In this example if Va is less than Vb then the output of the device is a logic "1." If Va is greater than or equal to Vb then the output of the device is a logic "0."

In another embodiment, the devices can be formed using conductive inks. Conductive inks are used to print circuits on a variety of substrate materials. Conductive inks contain conductive materials such as powdered or flaked silver materials.

Conductive inks can be used to implement IBG circuits because the properties of the inks used to print the circuit can be varied to create devices that have different properties. For example, some devices can be printed using conductive ink having an amount of conductive material. Then, conductive ink that has more (or less) conductive material is used to print another portion of the circuit. The circuit then can have devices that look similar and operate differently or look different and operate the same.

One possible method of reverse engineering IBG circuits is to physically measure the devices in the circuit. This can be done using a probe to measure the actual voltage generated by the circuit. In order to thwart this method of reverse engineering, the IBG cells are placed randomly spaced throughout the design. This makes it more difficult to probe the large number of IBG circuits required to reverse engineer the design.

In an alternative embodiment, the types of IBG circuits used are randomly distributed. For example, every third "AND" gate is implemented using an IBG circuit while every fourth "NAND" gate is implemented using an IBG circuit. As the number of devices implemented by IBG circuits is increased, the difficulty in reverse engineering the chip is increased. Additionally, as the number of types of logic devices implemented by IBG is increased, the difficulty in reverse engineering the chip is increased.

In another embodiment, logic blocks are made having logic devices therein. Within each logic block, the IBGs are randomly distributed within the logic block. As a result, different types of logic devices within each logic block are comprised of IBG devices.

In another embodiment, logic blocks are made having logic devices. The designer determines for the logic blocks a critical point and uses an IBG to implement the critical point. The critical point is a point within the logic the block where it is necessary to know the function or output value in order to determine the function of the logic block. Implementing the critical point within the logic block by an IBG is advantageous because this ensures that IBG has maximum effect in preventing reverse engineering. The inability to determine the value of critical point will necessarily prevent the reverse engineer from determining the proper function for the logic block.

For example, if the logic block is an ADDER, replacing a digit in the output can make it impossible to determine the function of the adder. That is because someone trying to reverse engineer the chip monitoring the function of the logic block would expect a specific output for an ADDER. When the replaced digit does not give the expected result, it is not determined that the logic block is functioning as and ADDER.

Another advantage of the disclosed system and method is that chip can be designed using standard tools and techniques. Methods of designing a chip are described in the following paragraphs.

A designer creates an overall design for the chip and for logic blocks within the chip. The design is created in a known hardware design language such as Verilog or VHDL. The design is then synthesized into standard logic which converts the design to the optimized gate level. Synthesis may be performed using standard synthesis tools such as Talus Design, Encounter RTL Designer, and Design Compiler. The synthesis maps the logic blocks into standard logic using a standard cell library provided by the supplier. Next, a place and route tool is used to create a physical implementation of the design. This step involves creating a floorplan, a power grid, placing the standard cells, implementing a clock tree, and routing connectivity between cells and input/output pins. Some examples of place and route tools are Talus Vortex, Encounter Digital Implementation, and IC Compiler. Using this process there are various ways to design a chip using IBG devices. One way is to create and characterize one or more new standard cell libraries and use the one or more new standard cells at the beginning of the process. Another approach is to place the IBG devices during the place and route step, either automatically or manually.

Another method of designing a chip is for the designer to create the design using a schematic entry tool. The designer creates a circuit by hand comprising the base logic gates. The designer can optimize the logic functionality using Karnaugh-maps. A layout entry tool is used to create the physical implementation of the design. The designer draws polygons to represent actual layers that are implemented in silicon. Using this approach the designer places IBG devices at any desired location.

Because the above devices result in a design that is difficult to reverse engineer using the conventional tear down techniques, another method may be implemented to reverse engineer the chip. Another known method of reverse engineering is to probe the device while active in order to establish the operating values of the internal devices. In order to perform these methods, the reverse engineer must remove some layers of the wafer to expose the output contacts of the devices. One way to make this technique more difficult is to randomly place the logic devices as described above. Another technique is to design a chip that is physically resistant to these techniques.

In many of the techniques described, the output voltage level of a device is used to determine the operation of the device. But, any other operating characteristic of the device could be used. For example, the rise time of the device, the current drawn, or the operating temperature can be used in the IBG. Also, more than one physical property of the device can be varied. For example, the geometry and the doping level can be controlled to implement an IBG.

Figure 18:
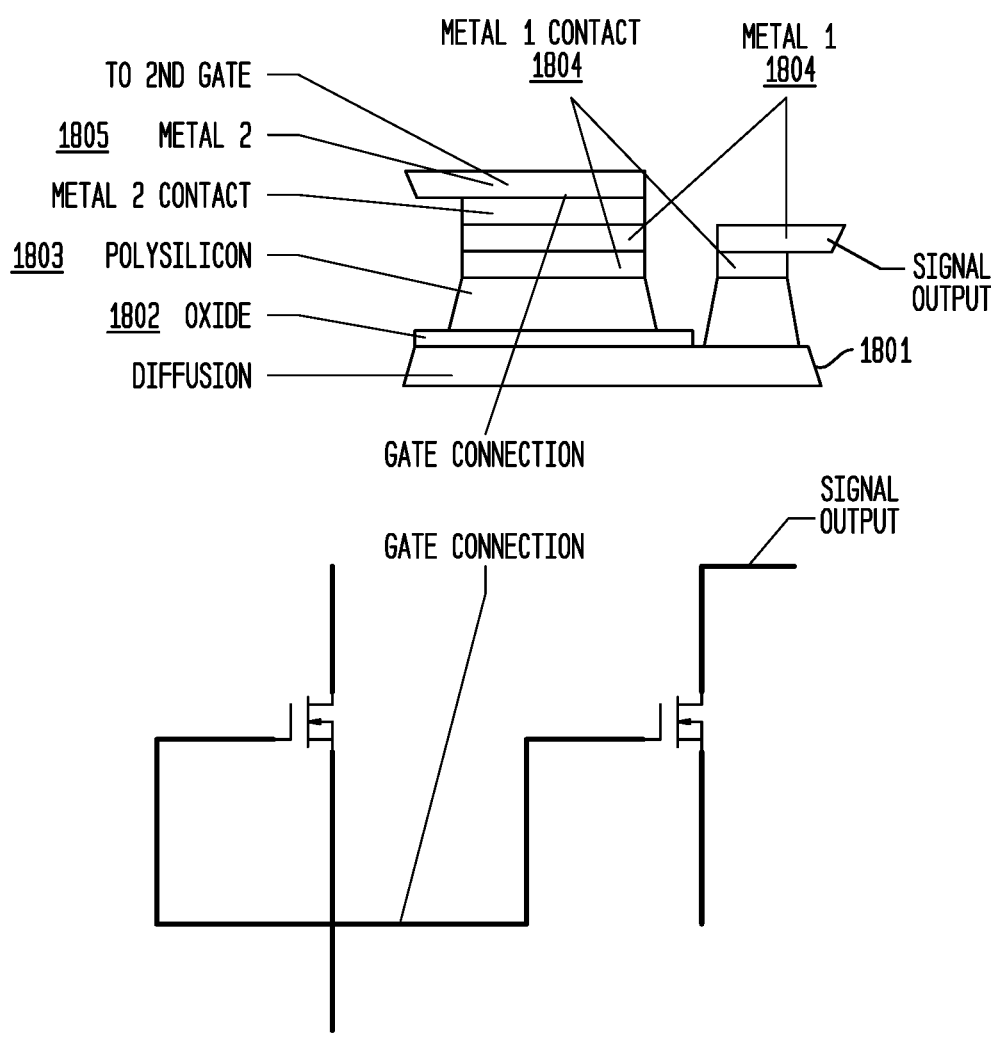
FIG. 18 illustrates a side view of a silicon wafer having active devices.

FIG. 18 illustrates the layers of a silicon wafer that is resistant to electronic testing of the chip. The wafer has a base layer 1801 that includes the diffusion layer. The oxide layer 1802 is on top of the diffusion layer 1801. The polysilicon layer 1803 is located on top of the oxide layer with the metal layer 1 1804 located thereon. The signal outputs are formed in metal layer 1 1804. Metal layer 2 1805 is located on top of the metal layer 1 1804. The gate connections are formed in metal layer 2 1805. With this layout it is necessary to remove a portion of metal layer 2 1805 in order to probe the signal outputs that are located in metal layer 1 1804. Removing a portion of metal layer 2 1805 disrupts the gate connections of the devices which in turn deactivates the devices. Thus, a reverse engineer trying to probe the device will destroy the functionally of the device during the reverse engineering process.

Figure 19:
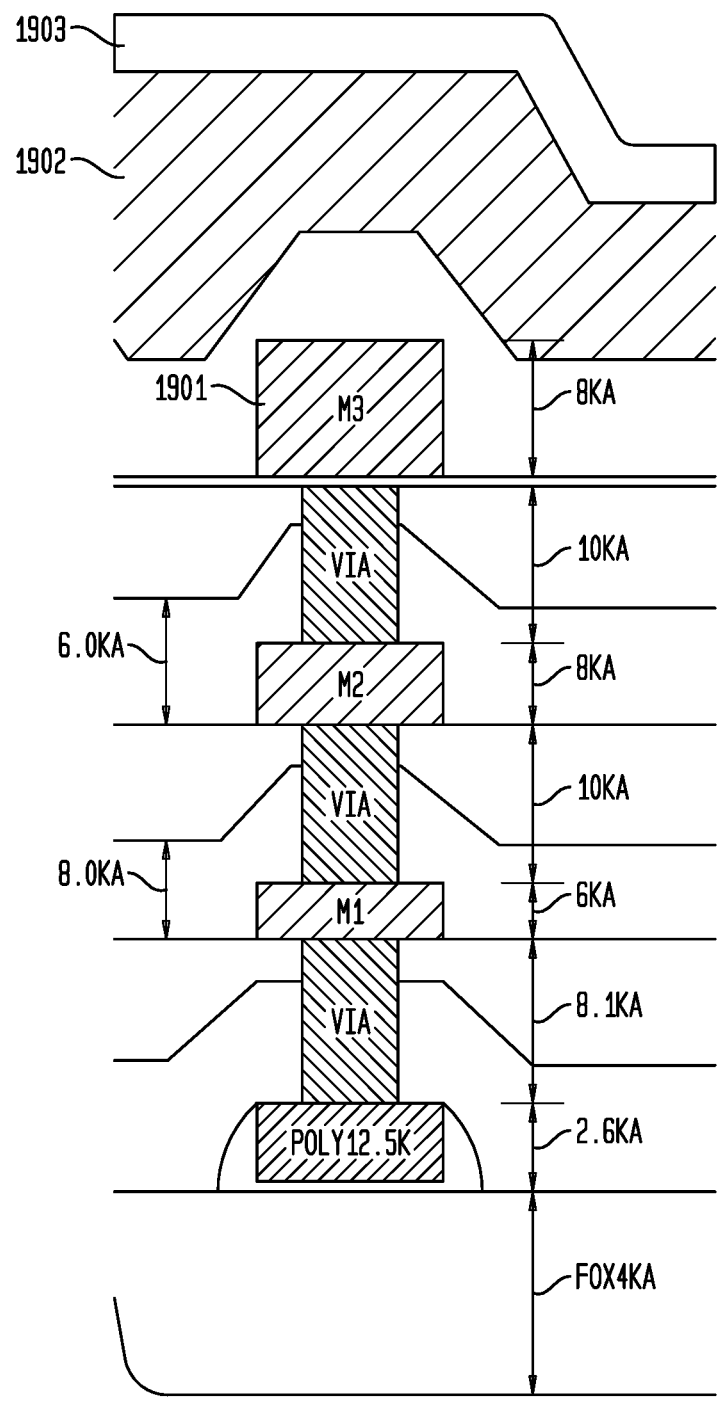
FIG. 19 illustrates another embodiment of a silicon wafer that is resistant to electronic testing of the chip.

FIG. 19 illustrates another embodiment of a silicon wafer that is resistant to electronic testing of the chip. In this embodiment, a metal layer such as a metal layer 1901 is provided. This metal layer 1901 may be a top metal layer. Multiple floating gates are connected to the metal layer 1901. The connection can be a direct connection, or the gates can be connected through several layers of metal to the top metal layer 1901. The level metal layer 1901 may be applied without any connection (floating) other than the connection to the floating gates. Additionally, it may be desirable to maintain a gap between the solid top level metal layer 1901 and the top level metal of the floating gates in order to minimize capacitance for proper IBG operation. As with the embodiment illustrated in FIG. 18, removing a portion of metal layer 1901 disrupts the gate connections of the devices which in turn deactivates the devices. Thus, a reverse engineer trying to probe the device will destroy the functionally of the device during the reverse engineering process. Furthermore, if the metal layer 1901 is exposed to energy from an ion beam source, the "floating" metal layer attracts the charge emanating from the ion beam source. This accumulated charge will cause MOSFET gate breakdown and create shorts between the gate, source, and drain of the floating gate device. This increases the current draw of the floating gate device and renders the circuit inoperative. A single ion beam edit through such a security shield may initiate MOSFET gate breakdown for several floating gate devices.

In an alternate embodiment, a dielectric layer 1902 may be disposed over at least a portion of the metal layer 1901. The dielectric layer 1902 may comprise a passivation layer, such as an oxide layer, for example. A metal layer 1903 may be disposed over at least a portion of the dielectric layer 1902 which is over the metal layer 1901. The metal layer 1903 is not connected to the metal layer 1901 and may be formed without any connection to active devices or conductive layers. If the metal layer 1903 is exposed to energy from an ion beam source, then the resulting charge on the metal layer 1903, which is separated from the metal layer 1901 by the dielectric layer 1902, causes gate failure of the devices connected to the metal layer 1901 due to MOSFET gate breakdown. Additionally, further layers of dielectric material and metal may be formed.

Multiple floating gates of a common type may be connected to a metal layer. For example, a plurality of floating gates of N-type devices may be connected to each other and to a first metal layer, and a plurality of floating gates of P-type devices may be connected to each other and to a second metal layer. The first and second portions of the top metal layer are not connected together, but may form a pattern over much of the layer comprising the first and second metal layers. If either portion is exposed to the energy from an ion beam source, all of the gates connected to that metal layer may experience MOSFET gate breakdown.

In many of the techniques described above, the output voltage level of a device is used to determine the operation of the device. But, any other operating characteristic of the device could be used. For example, the rise time of the device, the current drawn, or the operating temperature can be used in the IBG. Also, more than one physical property of the device can be varied. For example, the geometry and the doping level can be controlled to implement an IBG.

Figure 20A:
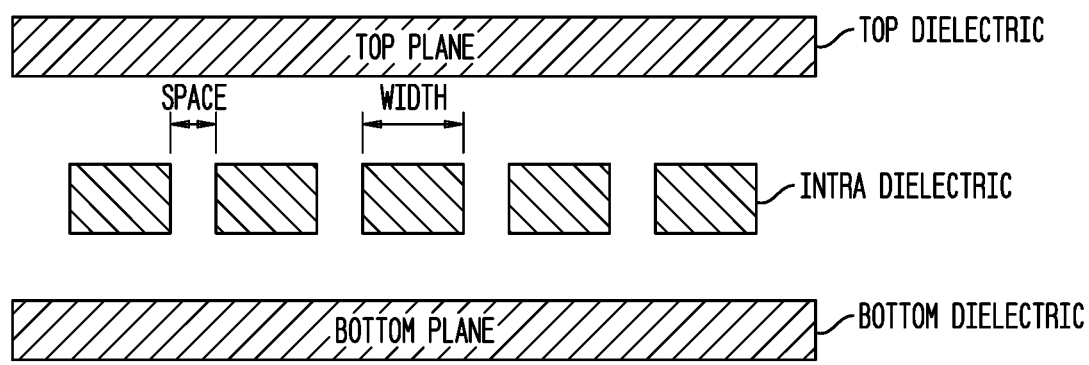
FIG. 20A illustrates a cross section of a MOS semiconductor device.

Another operating characteristic that is used the parasitic capacitances that are formed within MOSFET circuitry. FIG. 20A illustrates a cross section of a MOS semiconductor device. The semiconductor device has a top plane and a bottom plane with a top dielectric layer, an intra-dielectric layer, a bottom dielectric there between. The top and intra dielectric layers are typically comprised of metal, while the bottom dielectric layer is typically a substrate, diffusion, polysilicon, or metal structures.

Figure 20B:
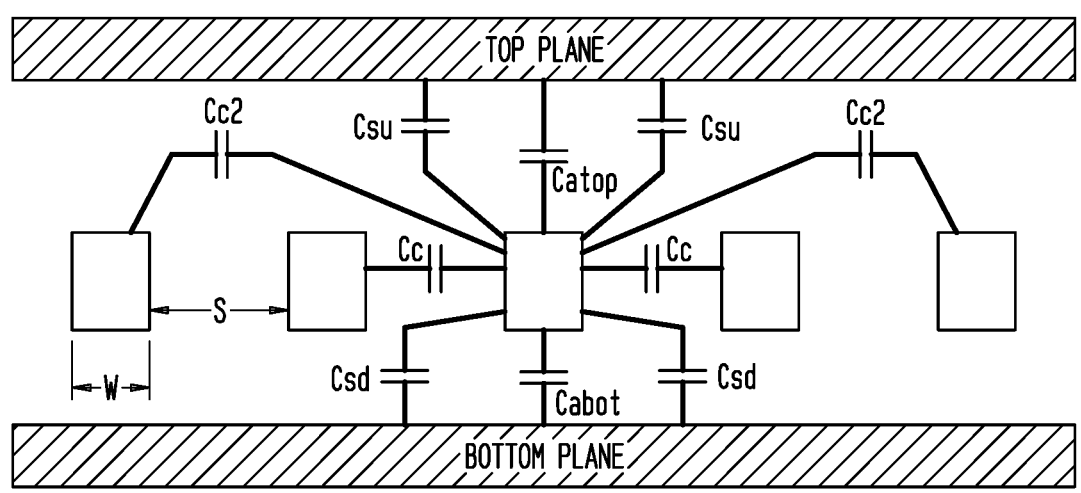
FIG. 20B illustrates parasitic capacitances and resistances in semiconductor device.

As shown in FIG. 20B, capacitors are formed in vertical and horizontal dimensions surrounding the structures because of the physical conductor-dielectric-conductor configuration of the MOS fabrication process. These capacitors are typically very small in value and considered parasitic for most designs. In addition, the metal connections in a circuit have resistance defined by the manufacturing process. Typically these metal resistances are low value and considered to be parasitic for most applications.

Figure 21:
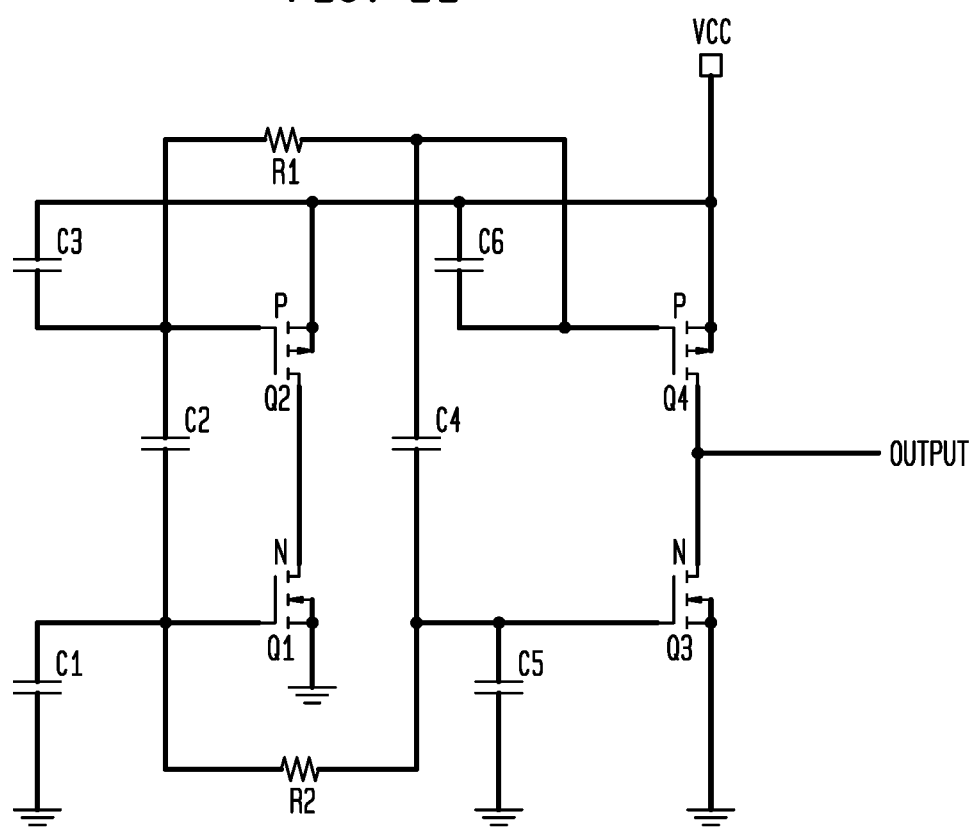
FIG. 21 illustrates an IBG circuit that utilizes parasitic capacitances.

Semiconductor devices that utilize floating gates are sensitive to these parasitic capacitances. Because an IBG device is based on floating gates, parasitic capacitances can be utilized to determine the state of the circuit. FIG. 21 illustrates an IBG device such as the one illustrated in FIG. 6 or FIG. 7. In FIG. 21, the resistors and capacitors illustrate the parasitic resistances and capacitances that are present in the circuit. Even if Q1, Q2, Q3, and Q4 have identical geometries and doping densities, the circuit output can be determined by the specific values of C1 thru C6, R1, and R2. In this case whether the IBG cell produces a "1" or a "0" is determined solely by the parasitic capacitance and resistance. This makes reverse engineering of the IBG circuit even more difficult. The reverse engineer has to account for small variations in doping levels and the parasitic capacitances and resistances that are present in order to determine the state of the IBG device.

Although the embodiment above describes parasitic capacitances and resistances, floating gate devices are sensitive to other parasitic elements. For example, a parasitic inductance may be used to change the operation of an IBG circuit.

The many features and advantages of the invention are apparent from the detailed specification. Thus, the appended claims are intended to cover all such features and advantages of the invention which fall within the true spirits and scope of the invention. Further, since numerous modifications and variations will readily occur to those skilled in the art, it is not desired to limit the invention to the exact construction and operation illustrated and described. Accordingly, all appropriate modifications and equivalents may be included within the scope of the invention.

Although this invention has been illustrated by reference to specific embodiments, it will be apparent to those skilled in the art that various changes and modifications may be made which clearly fall within the scope of the invention. The invention is intended to be protected broadly within the spirit and scope of the appended claims.

What is claimed is:

1. An electronic device comprising:
   a base layer;
   a first layer located at least partially over the base layer;
   a second layer located at least partially over the first layer;
   a first metal layer located at least partially over the second layer, wherein one or more signal outputs of the electronic device are formed in the first metal layer;
   a second metal layer located at least partially over the first metal layer, wherein the second metal layer is floating and one or more gate connection is connected to the second metal layer,
   a third metal layer located at least partially over the second metal layer and separated from the second metal layer by a dielectric, wherein removing a portion of the third metal layer results in at least one gate failure of the gates connected to the second metal layer.

2. The electronic device of claim 1 wherein the dielectric is a passivation layer.

3. The electronic device of claim 1 further comprising a fourth metal layer located at least partially over the third metal layer, wherein exposing the fourth metal layer to an ion beam results in at least one gate failure of the gates connected to the second metal layer.

* * * * *